United States Patent [19]

Goswami et al.

[11] Patent Number: 4,652,398

[45] Date of Patent: Mar. 24, 1987

[54] RAPID CURING, THERMALLY STABLE ADHESIVE COMPOSITION COMPRISING EPOXY RESIN, POLYIMIDE, REACTIVE SOLVENT, AND CROSSLINKER

[75] Inventors: Jagadish C. Goswami, New City; Richard A. Rehder, Mahopac, both of N.Y.; Anthony L. DeSalvo, Greenwich, Conn.

[73] Assignee: Stauffer Chemical Company, Westport, Conn.

[21] Appl. No.: 851,605

[22] Filed: Apr. 14, 1986

Related U.S. Application Data

[63] Continuation-in-part of Ser. No. 774,431, Sep. 12, 1985, which is a continuation-in-part of Ser. No. 660,593, Oct. 15, 1984, Pat. No. 4,604,230.

[51] Int. Cl.$^4$ .............................................. H01B 1/06
[52] U.S. Cl. ................................... 252/514; 252/512; 252/513; 523/400; 523/444; 523/458; 523/459; 525/423; 525/426; 525/430

[58] Field of Search ............... 523/400, 412, 413, 414, 523/444, 458, 459; 252/512, 513, 514; 525/423, 430, 426, 529

[56] References Cited

U.S. PATENT DOCUMENTS

| | | | |
|---|---|---|---|
| 4,100,140 | 7/1978 | Zahir et al. ............................. | 526/90 |
| 4,401,777 | 8/1983 | Tsuboi et al. ......................... | 523/451 |
| 4,525,572 | 6/1985 | Diethelm et al. ..................... | 528/170 |
| 4,557,860 | 12/1985 | DiSalvo et al. ....................... | 252/512 |

*Primary Examiner*—Theodore E. Pertilla
*Attorney, Agent, or Firm*—Richard P. Fennelly

[57] ABSTRACT

A novel adhesive exhibiting low outgassing upon exposure to high temperatures is disclosed. The instant adhesive comprises: (a) an epoxy resin, (b) a soluble polyimide resin, (c) a reactive solvent; and (d) an alkenylphenol crosslinker which preferably contains polyhydroxy and polyalkenyl substituents. Optionally, the adhesive may also contain a conductive material.

40 Claims, No Drawings

RAPID CURING, THERMALLY STABLE ADHESIVE COMPOSITION COMPRISING EPOXY RESIN, POLYIMIDE, REACTIVE SOLVENT, AND CROSSLINKER

This application is a continuation-in-part of copending application Ser. No. 774,431, filed Sept. 12, 1985, which in turn is a continuation-in-part application of copending application Serial No. 660,593, filed Oct. 15, 1984, now U.S. Pat. No. 4,604,230 issued 8/5/86.

FIELD OF THE INVENTION

The present invention relates to an adhesive composition useful as a die attach material which exhibits very low levels of outgassing upon exposure to high temperatures and which has a very low level of ionic contamination.

BACKGROUND OF THE INVENTION

Adhesive compositions, particularly conductive adhesives, have recently gained great popularity in the microelectronics industry. These adhesives are used for a variety of purposes with one of the more prominent uses being the attachment of a semiconductor die, dies or chips, to a substrate, or other support medium. One common problem associated with these adhesives is that upon exposure to high temperatures they exhibit a tendency to undergo outgassing, wherein absorbed or occluded gases, formed during the curing of the adhesive, or during subsequent heat aging of the cured adhesive due to thermal instability, are released. This is a critical problem since, all too often, the success or failure of an electrical component is a direct function of the degree of outgassing undergone by the adhesive resulting in void formation within the adhesive, thereby adversely affecting the thermal and electrical properties of the adhesive. Another problem in regard to such adhesives is ionic contamination by alkali metal (e.g., sodium and/or potassium) and chloride species which, under certain circumstances, can lead to corrosion of the electrical leads in the vicinity of the adhesive.

Recently, in U.S. Pat. No. 4,557,860 to A. L. DiSalvo et al. an adhesive system was described which comprised, as essential ingredients, an epoxy resin, a soluble polyimide resin, and a monoepoxy diluent. Such an adhesive is curable by use of conventional epoxy curing agents. If conductive adhesives are desired with such components, a suitable conductive filler can be added to such compositions.

SUMMARY OF THE INVENTION

In accordance with the present invention, there is disclosed a novel adhesive which exhibits very low levels of outgassing upon exposure to high temperatures as well as low ionic contamination levels. The adhesive of the present invention also exhibits low volume resistivity thereby showing good electrical conductivity.

The present adhesive comprises, as essential ingredients in its curable formulation, an epoxy resin, a soluble polyimide resin, a reactive solvent to dissolve the polyimide into the epoxy resin, and, as a crosslinking agent, and an alkenylphenol crosslinking agent, e.g., an aromatic compound containing polyhydroxy and polyalkenyl substitution. A curing aent, which can be added after the adhesive is manufactured and shipped to the ultimate end user, is another essential component needed to ultimately cure the system.

Optional ingredients include other crosslinkers and free radical catalysts, particularly when substantial vinyl functionality is present in the reactive solvent. Fillers designed to enhance the characteristics of the system, particularly those designed to give the adhesive electrical and/or thermal conductivity can also be used.

DETAILED DESCRIPTION OF THE INVENTION

The epoxy resin component which forms one essential portion of the present adhesive (from about 20% to about 35% by weight of the curable adhesive composition, preferably from about 25% to about 30%) is a conventional crosslinkable polyfunctional epoxy resin. The epoxy resins useful in this invention are those resins which contain more than one 1,2-epoxy group per molecule. They can be saturated or unsaturated aliphatic, cycloaliphatic, or heterocyclic groups and can be monomeric or polymeric in nature. The weight per epoxide of such resins can be within the range of about 100 to about 2,000.

Useful epoxy resins are the glycidyl polyethers of polyhydric phenols which are derived from an epihalohydrin, e.g., epichlorohydrin, and a polyhydric phenol. Examples of such polyhydric phenols include resorcinol, hydroquinone, bis(4-hydroxyphenyl)-2,2-propane (or "bisphenol A" as it is commonly known), 4,4'-dihydroxybenzophenone, bis(4-hydroxyphenyl)-1,1-ethane, bis(4-hydroxyphenyl)-1,1-isobutane, bis(4-hydroxyphenyl)-2,2-butane, bis(2-dihydroxynaphthyl)methane, phloroglucinol, and bis(4-hydroxyphenyl)sulphone. Additional polyhydric phenols are novolac resins containing more than two phenol, or substituted phenol, moieties linked through methylene bridges, as well as halogenated, e.g., brominated and chlorinated, phenolic compounds.

Additional epoxy resins are glycidyl polyethers of polyhydric alcohols prepared by reacting a polyhydric alcohol with an epihalohydrin using a Lewis acid catalyst, e.g., boron trifluoride, and subsequently treating the resulting product with an alkaline dehydrogenating agent. Included among the polyhydric alcohols that can be used in the preparation of these polyepoxy materials are glycerine, ethylene glycol, propylene glycol, diethylene glycol, hexanediol, hexanetriol, trimethylolpropane, trimethylolethane, pentaerythritol and the like.

Other epoxy resins are glycidyl esters of polycarboxylic acids which are derived from an epihalohydrin and a polycarboxylic acid. Examples of polycarboxylic acids include phthalic acid or its anhydride, isophthalic acid, terephthalic acid, tetrahydrophthalic acid, hexahydrophthalic anhydride, adipic acid, dimerized fatty acids, dibasic acids made from an unsaturated fatty acid and acrylic acid, and the like.

The most preferred epoxy resins are glycidyl polyethers of polyhydric phenols, particularly the glycidyl polyether of bisphenol A and epoxylated phenol or cresol novolac resins which are particularly preferred.

The soluble polyimide component of the present invention is present at from about 2% to about 15%, by weight of the adhesive composition of polyimide, epoxy, reactive solvent and aromatic crosslinker, preferably from about 3% to about 10%. The type of polyimide resins described in U.S. Pat. No. 3,856,752 to J. Bateman et al. which are commercially available from Ciba-Geigy Corporation under the trademark XU218, are especially suitable resins which can be utilized. These are fully imidized polyimide resins which are soluble in various solvents, and they are derived from phenylindane diamines and dianhydrides as described more fully in the above-reference U.S. patent which is incorporated herein by reference. These polyimides can be prepared by reacting a phenylindane diamine with a dianhydride in an organic reaction medium which is a solvent for at least one of the reactants, preferably under anhydrous conditions under 100° C. The resulting product is a polyamide acid which is then converted to the desired polyimide by one of several methods: heating the polyamide acid solution until imidization is substantially complete; or by combining the polyamide acid solution and a dehydrating agent, with or without catalyst, and optionally heating the resulting mixture until imidization is substantially complete. Thus, it will be appreciated that a polyamide acid solution, or a partially imidized polyamide acid solution, provided it is soluble in the polyimide solvent of the present invention, can also be used in the present invention.

The third essential component of the present invention is a reactive solvent which allows for dissolution of the soluble polyimide resin into the epoxy resin component prior to curing of the resin but which, after curing, becomes an integral part of the cured adhesive matrix. These solvents can contain, for example, an epoxide group at one end of its molecule linked to an aryl substituent at the other end. Representative solvents of this type include phenyl glycidyl ether, cresyl glycidyl ether, and styrene oxide. Another type of reactive solvent which is useful in the adhesives of the present invention are those having vinylic unsaturated sites. A preferred solvent is N-vinyl pyrrolidone. The amount of this solvent which can be used ranges from about 40% to about 55%, preferably from about 45% to about 55%.

The present invention comprises, as a fourth essential component, the use of a novel crosslinking agent in the subject adhesive. The crosslinking agent used is an alkenylphenol crosslinking agent of the type described in U.S. Pat. No. 4,100,140 to S. Zahir et al. for reaction with polymaleimides. Preferably, it is an aromatic compound containing polyhydroxy and polyalkenyl substitution on its aromatic ring nucleus. The hydroxy functionality enables this agent to react with the epoxy functionality contained by the epoxy resin and a reactive monoepoxy diluent, if used as the reactive solvent. The polyalkenyl substitution is particularly useful when other reactive vinyl moieties (e.g., a vinylic solvent) are present in the adhesive, but, for reasons not fully understood, it also functions well in adhesive systems substantially free of materials containing vinylic groups and free radical initiators. The presence of more than one hydroxy and alkenyl substituent preferably insures that the compound can appropriately react with two other molecules thereby serving as a crosslinking moiety within the ultimate adhesive matrix desired for the present invention. The aromatic nucleus for the compound can be monophenyl, biphenyl or bisphenol. In the latter case, the two phenyl rings are joined together by a linking group such as isopropylidene in the case of bisphenol A. The alkenyl group is preferably lower alkenyl, such as allyl, and has the vinyl group in a position available for appropriate reaction, i.e., preferably in the alkenyl group at its terminal position away from the ring. One preferred crosslinking compound which can be used with the present invention is 2,2'-diallyl bisphenol A, also named 4,4'-isopropylidenebis[2-allylphenol] which has Chemical Abstracts Registry No. 1745-89-7.

Other compounds within the class of alkenylphenol crosslinkers include 4,4'-hydroxy-3,3'-allyl-diphenyl, bis-(4-hydroxy-3-allylphenyl)-methane, 2,2-bis-(4-hydroxy-3,5-diallyl-phenyl)-propane and eugenol. The selected alkenylphenol compound crosslinker can be present at from about 10% to about 25% (preferably 10–20%), by weight of the four component adhesive described above.

When it desired to utilize the previously described, curable adhesive, it is combined with an effective amount of a curing agent to render it curable. This curing agent, although needed to cure the system, can be added by someone other than the formulator of the adhesive and it is therefore considered to be an optional component in regard to the curable adhesive composition. Generally, an effective amount of from about 0.1% to about 1.0%, by weight of the four previously described additives, is sufficient, preferably 0.3–0.8%. The preferred curing agent is an alkyl or aryl substituted imidazole compound. Preferred compounds of this type which may be used in the present invention include 2-ethyl, 4-methyl imidazole (EMI brand from Aldrich chemical), 2-methylimidazole, and the like.

Additional and optional crosslinking agents can also be used in the present invention. These can be present in amounts ranging, for example, up to about 15% by weight of the four component adhesive composition, preferably 7% to about 14%. The crosslinking agent is reactive with any vinylic unsaturation that might be contained in the adhesive system and can be chosen from polyethylenically unsaturated organic compounds copolymerizable with monovinyl or other ethylenically unsaturated organic compounds.

Representative crosslinking agents include, but are not limited to, triallyl-S-triazine-2,4,6 trione, triallyl cyanurate, triallyl phosphate, triallyl phosphite, triallyl trimellitate, trially trimesate, tetrallyl pyromellitate, dially diglycolate, diallyl diglycol carbonate, diallyl fumarate, diallyl isocyanate, diallyl itaconate, diallyl maleate, diallyl malonate, diallyl phthalate, and divinyl compounds, e.g. divinyl sulfone, divinyl sebacate, divinyl ethers and divinyl benzene.

Other compounds useful as optional crosslinking agents in the composition of the present invention include: glycol diacrylates and triacrylates, glycol di- and trimethacrylates, ethylene glycol dimethacrylate, propylene glycol dimethacrylate, 1,3-butylene glycol dimethacrylate, and trimethylolpropane trimethacrylate.

Additional compounds useful as crosslinking agents in the present invention include: diallyl succinate, diallyl adipate, diallyl sebacate, diallyl ethylene carbonate, triallyl aconitate, triallyl borate, triallyl citrate, triallyl pyromellitate, triallyl aluminate, triallyl titanate, tetraallyl benzene tetracarboxylate, tetrallyl thiophosphonate, and triallyl phenylphosphate.

To facilitate the crosslinking reaction between the solvent for the polyimide resin and the crosslinking agent, the present invention can also use an optional free radical catalyst in amounts ranging up to about 5% by weight of the aforementioned four component adhesive mixture, preferably from about 1% to about 2%. Contemplated catalysts usable in the present invention include any free radical generating polymerization catalyst having a half life preferably, but not necessarily, of the same order as the cure time at the temperature chosen.

Preferred catalysts are organic peroxides (e.g., from Lucidol Division, Pennwalt Company) including, for example, di-t-butyl peroxide, t-butyl peroxypivalate, 2,4-dichlorobenzoyl peroxide, caprylyl peroxide, lauroyl peroxide, propionyl peroxide, acetyl peroxide, t-butylperoxyisobutyrate, p-chlorobenzoyl peroxide, benzoyl peroxide, hydroxyheptyl peroxide, cyclohexanone peroxide, 2,5-dimethylhexyl-2,5-di(peroxybenzoate), di-t-butyl diperphthalate, t-butylperacetate, t-butylperbenzoate, dicumyl peroxide, 2,5-dimethyl-2,5-di(t-butylperoxy)hexane, t-butyl hydroperoxide, methyl ethyl ketone peroxides, p-methane hydroperoxide, cumene hydroperoxide, 2,5-dimethylhexyl-2,5-dihydroperoxide, and t-butyl hydroperoxide.

Also useful as catalysts in the present invention are gem-diperoxides (as defined in O. Hagell and S. Sheppard, Encyclopedia of Chemical Technology, Vol. 14 (1967) p.786) or peroxyketals. Representative peroxyketals useful in the present invention include, 1,1-bis(-butylperoxy)3,3,5-trimethyl-cyclohexane, 1,1-di-(t-butylperoxy)cyclohexane, 2,2-bis(t-butylperoxy)butane, ethyl 3,3-di(butylperoxy)butyrate, and n-butyl-4,4-bis(t-butylperoxy)valerate.

Other peroxide derivatives useful as catalysts in the present invention are t-amyl peroxides (from Lucidol Division, Pennwalt Company). Representative t-amyl peroxides include: t-amylperoxyneodecanoate, t-amylperoxyneoheptanoate, t-amylperoxy pivalate, t-amylperoxy-2-ethyl hexanoate, t-amyl peroxybenzoate, t-amyl peroxyacetate, 1,1-di-(t-amylperoxy)-cyclohexane, 2,2-di-(t-amylperoxy)propane ethyl, 3,3-di-(t-amyl-peroxy)butyrate, and 0,0-t-amyl 0-(2-ethylhexyl)-monoperoxycarbonate.

Also useful as a catalyst in the present invention is the compound 1,1-azobis(cyclohexanecarbonitrile) sold under the trademark VAZO 88 by DuPont Company.

Optionally, in order to improve the screen printability (wettability of the adhesive composition to a polyolefin carrier film used as a substrate for the transfer of the adhesive, to be described more fully below), the adhesive composition of the present invention can have incorporated therein a filler such as glass, silica (e.g. CAB-O-SIL silica filler) in an amount ranging up to about 5% by weight of the four component adhesive composition, preferably from about 0.5% to about 2.0%. The filler also assists in the reduction of any voids or pinholes which might otherwise be generated in the cured adhesive. The preferred filler is glass of a size less than 10 microns available from Transene Corporation, under the designations TGC-230, TGC-10, etc. If a glass filler is used, preferably the melting point of the glass should be between 350° C. and 500° C. If silica is used as a filler, the size should be less than 1 micron. Said grade of silica is available from Degussa and sold under the designation TS-100.

Metals, optionally present in the compositions of the present invention, are used to impart electrical and thermal conductivity to the adhesive of the present invention. The metal particles can be employed in an amount ranging from about 150% to about 350% by weight of the four component adhesive composition, preferably from about 200% to about 300%. To achieve volume resistivity in the final cured product of 0.1 ohm/cm or less, it is preferred that the particles be noble metals such as silver or gold or noble metals coated on non-noble metals such as copper, iron, nickel, or aluminum. For easy dispersion, the metal particles should preferably be of a size less than 10 microns. The preferred metal is silver and a preferred grade of silver is that sold under the designations SF-235, SF-282, etc. by Handy and Harman.

If only thermal conductivity is desired, similar levels of insulative fillers (e.g., aluminum oxide) can be used in the present adhesives.

In some cases, e.g., in the case of silver, the filler will confer both electrical as well as thermal conductivity.

The type of adhesive composition which is formed by using these components has utility in various bonding-applications where high temperature characteristics are important. For example, metal-to-metal bonding and plastic bonding in high temperature environments are examples of where the adhesive can find utility.

Since the adhesive of the present composition can also have good conductive properties, as determined by standard volume resistivity measurements well known to those skilled in the art to which this invention pertains, one particularly suitable use is semiconductor die bonding to chip substrates.

The present invention is further illustrated by the Examples which follow which give certain preferred embodiments for the adhesive of the present invention.

EXAMPLE 1

This illustrates an embodiment of the adhesive of the present invention which does not contain a vinylic solvent for the soluble polyimide resin, a free radical catalyst, or an optional crosslinking agent reactive with the solvent. It contains such optional preferred embodiments as silica filler, conductive silver powder and imidazole catalyst.

The formulation is formed from the following ingredients:

| Ingredients | Parts by Weight |
| --- | --- |
| Soluble polyimide resin | 4.0 |
| Phenyl glycidyl ether | 32.0 |
| Phenol epoxy novolac resin | 16.0 |
| 2,2'-diallyl bisphenol A* | 18.0 |
| 2-ethyl-4-methyl imidazole** | 2.0 |
| Silica filler | 0.4 |
| Silver powder | 130.0 |

*67% in N—methyl pyrrolidone solvent. This was used in later Examples as well.
**10% solution in N—methyl pyrrolidone solvent. This was used in later Examples as well.

One mil of this adhesive was partially cured (or "B-staged") to a tacky state by exposing it to a temperature of 60° C. for 15 minutes. The resulting tacky film was transferred to a silicon chip (200×200 mils) which was then adhered to a glass substrate.

The resulting combination was flash cured at 235° C. for 30 seconds. Void formation was judged to be substantially absent. The room temperature die shear strength was over 35 lbs.

Extended curing of the chip/adhesive/substrate composite at 200° C. for 30 and 60 minutes gave the same results as the flash cure procedure.

EXAMPLE 2

In this embodiment, a vinylic solvent (N-vinyl pyrrolidone), free radical catalyst (t-butyl peroxybenzoate), and crosslinking agent (tri-allyl-5-triazine-2,4,6-trione) were used in addition to the components shown in the formulation of Example 1. These three added components supply additional polymerizable vinylic capability to the overall system. The formulation is as follows:

| Ingredients | Parts by Weight |
| --- | --- |
| Soluble polyimide resin | 1.2 |
| Phenyl glycidyl ether | 12.0 |
| N—vinyl pyrrolidone | 1.0 |
| Phenol epoxy novolac resin | 8.0 |
| 2,2'-diallyl bisphenol A solution | 7.0 |
| 2-ethyl-4-methylimidazole solution | 2.0 |
| Tri-allyl-S—triazine-2,4,6 trione | 2.0 |
| t-butyl peroxybenzoate | 0.3 |
| Silica filler | 0.3 |
| Silver powder | 72.0 |

One mil of the liquid adhesive was B-staged to a tacky state by exposure to 67° C. for 20–25 minutes. The tacky film was transferred to a silicon chip (200×200 mils) which was then adhered to a glass substrate. The composition was flash cured to 250° C. for 30 seconds. The bond strength was judged excellent since 35 lbs. was needed to dislodge the chip from the substrate. The amount of undesired void generation in the adhesive was negligible.

The ionic impurity levels were very low: 7.5 ppm chloride; under the detection limit of 2.5 ppm for sodium; and under the detection limit of 5.0 ppm for potassium.

EXAMPLE 3

This formulation is similar in regard to the general types of components to the adhesive of Example 2.

| Ingredients | Parts by Weight |
| --- | --- |
| Soluble polyimide resin | 4.2 |
| Phenyl glycidyl ether | 16.0 |
| N—vinyl pyrrolidone | 16.0 |
| Phenol epoxy novolac resin | 16.0 |
| 2,2'-diallyl bisphenol A solution | 12.0 |
| 2-ethyl-4-methylimidazole solution | 2.0 |
| Triallyl-S—triazine-2,4,6 trione | 6.0 |
| Di-t-butyl peroxide | 1.0 |
| Silica filler | 0.4 |
| Silver powder | 130 |

The B-staging of this adhesive was at 60° C. for 15 minutes, and the chip attachment step was preformed as described in Example 2.

After flash curing at 250° C. for 30 seconds, the void formation in the adhesive was judged to be negligible and the room temperature die shear was over 35 lbs.

Extended curing at 120° C. for 45 minutes followed by 280° C. for 30 minutes gave negligible void formation, a room temperature die shear of over 35 lbs., and a hot die shear (measured at 300° C. for 60 seconds) of 35 lbs.

Water extractable ionic impurities of the extended cured adhesive were found to be: 5.9 ppm chloride; under the 2.5 ppm detection limit for sodium; and under the 5.0 ppm detection limit for potassium.

EXAMPLE 4

This Examples is similar to Example 1 but further includes a free radical generating catalyst (di-t-butyl peroxide) to enable the unsaturated sites present in the diallyl bisphenol A compound to undergo self-cross-linking.

| Ingredients | Parts by Weight |
| --- | --- |
| Soluble polyimide resin | 4.0 |
| Phenyl glycidyl ether | 32.0 |
| Phenol epoxy novolac resin | 16.0 |
| 2,2'-diallyl bisphenol A solution | 18.0 |
| 2-ethyl-4-methyl imidazole solution | 2.0 |
| Di-t-butylperoxide | 1.0 |
| Silica filler | 0.4 |
| Silver powder | 130.0 |

The adhesive was similarly processed and yielded the following properties. The die shear values were for a 200 mil×200 mil chip on glass.

| Rapid Curing Cond. | Room Temp. Die Shear (lbs) |
| --- | --- |
| 180° C. for 30 sec. | 14 |
| 230° C. for 30 sec. | over 35 |
| 120° C./45 min + 280° C./30 min | over 35 |
| 175° C./45 min | over 35 |
| 120° C./30 min + 175° C./30 min | over 35 |
| 120° C./60 min | over 35 |
| 120° C./30 min | over 35 |
| 120° C./15 min | 35 |

EXAMPLE 5

This Example is again similar to Example 1 except that the phenyl glycidyl ether used to dissolve the polyimide resin was replaced by another solvent having an ethylenically unsaturated bond (i.e., N-vinyl pyrrolidone). The phenyl glycidyl ether embodiment of Example 1 yielded a composition which provided slightly better tackiness when B-staged. However, from a performance point of view, the phenyl glycidyl ether was not a critical additive as compared to the pyrrolidone.

The formulation is formed from the following ingredients:

| Ingredients | Parts by Weight |
| --- | --- |
| Soluble polyimide resin | 4.0 |
| N—vinyl pyrrolidone | 22.0 |
| Phenol epoxy novolac resin | 16.0 |
| 2,2'-diallyl bisphenol A solution | 18.0 |
| 2-ethyl-4-methyl imidazole solution | 2.0 |
| Tri-allyl-S—triazine-2,4,6-trione | 10.0 |
| Di-t-butyl peroxide | 0.4 |
| Silica filler | 0.4 |
| Silver powder | 130.0 |

Due to the more volatile nature of the N-vinyl pyrrolidone, the adhesive was B-staged at 50° C. for 10 minutes instead of 60° C. for 15 minutes as in Example 1.

The properties of this composition when tested in accordance with Examples 1 and 4 were:

| | Room Temp. Die Shear (lbs) |
| --- | --- |
| Rapid Curing Cond. | |
| 240° C./30 sec | over 35 |
| Regular Curing Conditions | |
| 120° C./45 min + 280° C./30 min | over 35 |
| 120° C./45 min + 175° C./45 min | over 35 |

EXAMPLE 6

This Example illustrates certain additional property performance characteristics for the adhesive composition described in Example 3. This adhesive was tested for use as the adhesive pattern on the dicing film product described and claimed in U.S. Ser. No. 744,352, filed June 13, 1985, entitled "Adhesively Mountable Die Attach Film".

B-Staging

A 4 inch circle of the adhesive was successfully B-staged at 140° F. with a time processing window of 13 to 18 minutes. This is superior to prior adhesives which offered only a 1-3 minute window.

Voids and Die Movement

Samples B-staged at each minute period within the range of 13-18 minutes were each evaluated for dicing performance and compared in regard to void generation characteristics during curing. The following trends were observed:

(a) the die movement for the adhesive B-staged at 13 minutes was judged to be fair. Increasing the B-staging time resulted in a concomitant decrease in die movement with the results at 18 minutes being judged to be very good.

(b) Void generation went from good at 13 minutes to fair at 18 minutes.

As a compromise, a 16 minute B-staging time was selected as giving the best balance of lack of die movement and low void generation.

Shelf Life

Room temperature shelf life studies have shown the adhesive, when printed into adhesive patterns on the aforementioned dicing film, to exhibit acceptable functional properties for at least four days.

Thermal Gravimetric Analysis (TGA)

Low weight loss values were obtained:

| Cure Schedule | Weight Loss (%) |
|---|---|
| 120° C./45 min + 280° C./30 min | |
| —wt. loss through cure: | 3.21 |
| +320° C. isotherm for 5 min: | 0.09 |
| | 3.30 |
| 120° C./15 min + 175° C./30 min | |
| —wt/ loss through cure: | 2.04 |
| +175° C. isotherm for 6 hours: | 0.39 |
| | 2.43 |

Electrical Conductivity

The following performance data were generated:

| Cure Schedule | Volume Resistivity (ohm-cm) |
|---|---|
| 175° C./60 min | $1.2 \times 10^{-3}$ |
| 175° C./120 min | $8.0 \times 10^{-4}$ |
| 175° C./180 min | $6.8 \times 10^{-4}$ |
| 175° C./240 min | $6.2 \times 10^{-4}$ |
| 120° C./45 min + 280° C./30 min | $9.9 \times 10^{-4}$ |

Die Shear

Excellent results were obtained as reported below:

| Curing Conditions of 200 × 200 mil Die | RT Die Shear (on glass) - lbs |
|---|---|
| 120° C./15 min + 175° C./30 min | over 30 |
| 90° C./30 min + 175° C./30 min | over 30 |
| 120° C./30 min + 175° C./30 min | over 30 |
| 120° C./35 min + 280° C./30 min | over 30 |
| 175° C./30 min | over 30 |
| 185° C./30 min | over 30 |
| 200° C./30 min | over 30 |
| 250° C./30 min | over 30 |

With a cure schedule of 120° C./45 min plus 280° C./30 min, the hot die shear on glass was over 10 lbs at 225° C. and over 10 lbs at 320° C.

| Curing Conditions of 50 × 50 mil Die | Die Shear (lbs) on Glass | | |
|---|---|---|---|
| | RT | 225° C. | 320° C. |
| 120° C./15 min + 175° C./30 min | 8.4 | 2.1 | 1.2 |
| 120° C./15 min + 200° C./30 min | 7.1 | 1.9 | 0.98 |
| 120° C./15 min + 225° C./30 min | 8.3 | 1.6 | 1.2 |
| 120° C./20 min + 225° C./30 min | 9.2 | 1.7 | 0.7 |
| 120° C./45 min + 280° C./30 min | 8.2 | 3.0 | 2.1 |

| | Die Shear (lbs) on Alloy 42 | | |
|---|---|---|---|
| | RT | 225° C. | 320° C. |
| 120° C./15 min + 175° C./30 min | 6.6 | 0.43 | 0.1 |
| 120° C./15 min + 200° C./30 min | 6.0 | 0 | 0 |

| | Room Temp. Die Shear (lbs) on Alloy 42 |
|---|---|
| 120° C./45 min + 280° C./30 min | 3.9 |

| | Die Shear (lbs) on Raw Cu | |
|---|---|---|
| | RT | 300° C. |
| 120° C./15 min + 175° C./30 min | 7.5 | 0.25 |

In summary, the adhesive that was tested was judged to having very acceptable performance in regard to: printability on a release coated support film; B-stage behavior (cohesive strength development at 140° F.); cover sheet release; wafer mount and wafer release; dicing performance; die pick and place; cure schedule development (void generation at various temperatures and at room temperature and hot die shear strength); shelf life studies at room temperature (daily inspection of a dicing film product for usage performance); electrical conductivity; and TGA scans for weight loss during curing cycles and additional high temperature isotherms.

It is preferred to use a particular mixing scheme for the various ingredients of the present adhesive in order to insure a homogeneous composition having the proper flow and curing characteristics. The first step involves dissolving the soluble polyimide resin in the reactive solvent (e.g., phenyl glycidyl ether, N-vinyl pyrrolidone, etc.) at elevated temperature. While the resulting composition is still warm, the epoxy resin is mixed into it to yield a uniform composition. After cooling to ambient temperature the alkenylphenol crosslinker and, if desired, curing agent (e.g., imidazole curing agent) is then added. The next step can include the addition of optional crosslinkers, such as the triallyl-S-triazine-2,4,5-trione compound. The following step can involve the very rapid addition and mixing of the catalyst (e.g., di-t-butyl peroxide) in order to avoid the tendency for any other component(s) to separate from the composition. Thereafter, silica filler and silver powder, if desired, can be added in and thoroughly mixed.

The foregoing should not be construed in a limiting sense since they are merely intended to illustrate certain embodiments of the present invention. The scope of protection desired is set forth in the claims which follow.

We claim:

1. An adhesive composition comprising: (a) an epoxy resin; (b) a soluble polyimide resin; (c) a reactive solvent to dissolve the soluble polyimide resin into the epoxy resin; and (d), as a crosslinker, an alkenylphenol compound.

2. A composition according to claim 1 wherein the soluble polyimide resin is a polyimide resin derived from phenylindane diamines and dianhydrides, polyamide acid or a partially imidized polyamide acid.

3. A composition according to claim 1 wherein said soluble polyimide resin comprises from about 2% to about 15% by weight of the composition mixture.

4. A composition according to claim 1 wherein the reactive solvent contains an epoxide group at one end of its molecule linked to an aryl substituent at its other end.

5. A composition according to claim 4 wherein said diluent is phenyl glycidyl ether.

6. A composition according to claim 1 wherein said reactive solvent comprises from about 40% to about 55% by weight of the adhesive composition.

7. A composition according to claim 1 wherein said reactive solvent is a compound containing vinylic unsaturation.

8. A composition according to claim 7 wherein said solvent is N-vinyl pyrrolidone.

9. A composition according to claim 1 wherein said epoxy resin is a glycidyl polyether of a polyhydric phenol.

10. A composition according to claim 1 wherein said epoxy resin is a phenol epoxy novolac resin.

11. A composition according to claim 1 wherein said epoxy resin comprises from about 20% to about 35% by weight of the adhesive composition.

12. A composition according to claim 1 wherein the alkenylphenol crosslinker is present at from about 10% to about 25% by weight.

13. A composition according to claim 1 wherein the alkenylphenol compound has a bisphenol nucleus.

14. A composition as claimed in 13 where the compound is 2,2'-diallyl bisphenol A.

15. A composition as claimed in claim 1 wherein the epoxy resin is a phenol epoxy novolac resin, the solvent comprises phenyl glycidyl ether, and the alkenylphenol compound has a bisphenol nucleus.

16. A composition as claimed in claim 15 wherein the alkenylphenol compound is 2,2'-diallyl bisphenol A.

17. A composition according to claim 1 further comprising an imidazole curing agent.

18. A composition according to claim 17 wherein said curing agent is 2-ethyl-4-methyl imidazole.

19. A composition according to claim 17 wherein said curing agent comprises from about 0.1% to about 1% by weight of the adhesive composition.

20. A composition according to claim 1 wherein said composition further comprises a crosslinking agent which is reactive with vinylic unsaturation in the composition, said agent being a polyethylenically unsaturated organic compound.

21. A composition according to claim 20 wherein said crosslinking agent is triallyl-S-triazine-2,4,6 trione.

22. A composition according to claim 20 wherein said crosslinking agent comprises up to about 15% by weight of the adhesive composition.

23. A composition according to claim 1 which further comprises a free radical catalyst.

24. A composition according to claim 23 wherein said free radical catalyst is an organic peroxide.

25. A composition according to claim 23 wherein said free radical peroxide is di-tertiary butyl peroxide.

26. A composition according to claim 23 wherein said free radical catalyst is a peroxyketal.

27. A composition according to claim 23 wherein said free radical catalyst is t-butyl peroxybenzoate.

28. A composition according to claim 23 wherein said catalyst is 1,1'-azobis(cyclohexanecarbonitrile).

29. A composition according to claim 23 wherein said catalyst comprises up to about 5% by weight of the adhesive composition.

30. A composition according to claim 1 further comprising filler material.

31. A composition according to claim 30 wherein said filler is glass.

32. A composition according to claim 31 wherein said filler material comprises glass fillers of a size less than 10 microns and of a melting point from about 350° C. to about 500° C.

33. A composition according to claim 30 wherein said filler is silica.

34. A composition according to claim 33 wherein said filler is silica of a size less than 1 micron.

35. A composition according to claim 30 wherein said filler material comprises up to about 5% by weight of the adhesive composition.

36. A composition according to claim 1 further comprising a conductive material.

37. A composition according to claim 36 wherein the conductive material is a noble metal.

38. A composition according to claim 37 wherein the noble metal is silver.

39. A composition according to claim 36 wherein the conductive material is a noble metal coated on a non-noble metal.

40. A composition according to claim 36 wherein the conductive material comprises from about 150% to about 350% by weight of the adhesive composition.

* * * * *